(12) United States Patent
Shu

(10) Patent No.: US 9,236,855 B2
(45) Date of Patent: Jan. 12, 2016

(54) COMPARATOR AND AMPLIFIER

(71) Applicant: MediaTek Inc., Hsin-Chu (TW)

(72) Inventor: Yun-Shiang Shu, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/504,787

(22) Filed: Oct. 2, 2014

(65) Prior Publication Data

US 2015/0015307 A1  Jan. 15, 2015

Related U.S. Application Data

(63) Continuation of application No. 13/612,789, filed on Sep. 12, 2012, now Pat. No. 8,878,608.

(60) Provisional application No. 61/555,297, filed on Nov. 3, 2011.

(51) Int. Cl.
*H03F 3/45* (2006.01)
*H03K 5/24* (2006.01)

(52) U.S. Cl.
CPC ............ *H03K 5/2481* (2013.01); *H03F 3/45* (2013.01); *H03F 3/45071* (2013.01); *H03F 3/45179* (2013.01); *H03F 3/45197* (2013.01); *H03K 5/249* (2013.01); *H03K 5/2472* (2013.01); *H03F 2203/45424* (2013.01); *H03F 2203/45466* (2013.01); *H03F 2203/45482* (2013.01); *H03F 2203/45492* (2013.01)

(58) Field of Classification Search
CPC ........................................................ H03F 3/45
USPC ................................................. 330/252, 253
See application file for complete search history.

(56) References Cited

U.S. PATENT DOCUMENTS

| 5,708,391 | A  | 1/1998  | Altmann et al. |
| 7,135,921 | B2 | 11/2006 | Tsuchi |
| 8,026,761 | B2 | 9/2011  | Nolan et al. |
| 2011/0181361 | A1 | 7/2011 | Nolan et al. |

FOREIGN PATENT DOCUMENTS

CN  1441547  9/2003

OTHER PUBLICATIONS

Van Der Plas, G., et al.: A 150MSs 133μW 7b ADC in 90nm digital CMOS Using a Comparator-Based Asynchronous Binary-Search sub-ADC; IEEE International Solid-State Circuits Conference; Session 12; 2008; pp. 242-244.

(Continued)

*Primary Examiner* — Khanh V Nguyen
*Assistant Examiner* — Khiem Nguyen
(74) *Attorney, Agent, or Firm* — McClure, Qualey & Rodack, LLP

(57) ABSTRACT

A comparator has a differential pair circuit and a current control circuit. The differential pair circuit has first and second comparator transistors, and is arranged to compare a first input and a second input according to a clock signal to generate a result indicating whether a difference of the first and second inputs exceeds an internal offset. The current control circuit is coupled in series with the differential pair circuit, and configured to provide unequal abilities of drawing currents for the first and second comparator transistors. An amplifier circuit is also disclosed, having a differential pair circuit, a current control circuit, an amplification circuit and a reset circuit.

17 Claims, 8 Drawing Sheets

(56) References Cited

OTHER PUBLICATIONS

Ellersick, W., et al.; "GAD: A 12-GSh CMOS 4-bit AD Converter for an Equalized Multi-Level Link;" Symposium on VLSI Circuits Digest of Technical Papers; 1999; pp. 49-52.

Lee, M.J.E., et al.; "Low-Power Area-Efficient High-Speed IO Circuit Techniques;" IEEE Journal of Solid-State Circuits; vol. 35; No. 11; Nov. 2000; pp. 1591-1599.

Van Der Plas, G., et al.: "A 0.16pJ Conversion-Step 2.5mW 125GSs 4b ADC in a 90nm Digital CMOS Process;" IEEE International Solid-State Circuits Conference; Session 31; 2006; pp. 1-10.

English language translation of abstract CN 1441547 (published Sep. 10, 2003).

Katyal, et al.: "A New High Precision Low Dynamic Comparator for High Resolution High Speed ADCs"; Iowa State University; (published on 2006); pp. 5-8.

He, et al.: "Analyses of Static and Dynamic Random Offset Voltages in Dynamic Comparators"; IEEE Transactions on Circuits and Systems; (published on 2009); pp. 911-919.

COMPARATOR AND AMPLIFIER

CROSS REFERENCE TO RELATED APPLICATIONS

This Application is a continuation of application Ser. No. 13/612,789, filed Sep. 12, 2013, now U.S. Pat. No. 8,878,608, which claims priority of U.S. Provisional Application No. 61/555,297, filed on Nov. 3, 2011, and the entirety of which is incorporated by reference herein.

BACKGROUND OF THE INVENTION

1. Field of the Invention

The present invention relates to electronic circuits, and in particular relates to a comparator circuit and an amplifier circuit.

2. Description of the Related Art

A voltage comparator compares a first input voltage to a second input voltage, and produces a digital representation, i.e., a binary 1 or 0, at the output indicating which input voltage is higher, that is, the polarity of the voltage difference between the two inputs. An offset comparator has a built-in offset voltage threshold such that the voltage difference of the first and the second inputs has to exceed this threshold in order to make the output switching the binary state.

However, the bias condition of the input differential pair limits the offset range of the built-in offset voltage. Conventionally, when the voltage difference between the two inputs is greater than a certain voltage value, the offset comparator may reach a saturation condition, wherein the built-in offset has no effect on the outcome of the comparator.

BRIEF SUMMARY OF THE INVENTION

In one aspect of the invention, a comparator is disclosed, comprising: a differential pair circuit and a current control circuit. The differential pair circuit is configured to comprise first and second comparator transistors, and compare a first input and a second input according to a clock signal to generate a result indicating whether a difference of the first and second inputs exceeds an internal offset. The current control circuit is coupled in series with the differential pair circuit, and configured provide unequal abilities of drawing currents for the first and second comparator transistors, respectively.

In another aspect of the invention, an amplifier is provided, comprising a differential pair circuit, a current control circuit, an amplification circuit, and a reset circuit. The differential pair circuit comprises first and second comparator transistors, and is configured to compare a first input and a second input to generate a result indicating whether a difference of the first and second inputs exceeds an internal offset. The current control circuit is configured to provide unequal abilities of drawing currents for the first and second comparator transistors, respectively. The amplification circuit amplifies the generated result from the differential pair circuit. The reset circuit is capable of setting a reference voltage point in the differential pair circuit to a predetermined voltage level when the clock signal is at a second logic level.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

A detailed description is given in the following embodiments with reference to the accompanying drawings.

Figure 1:
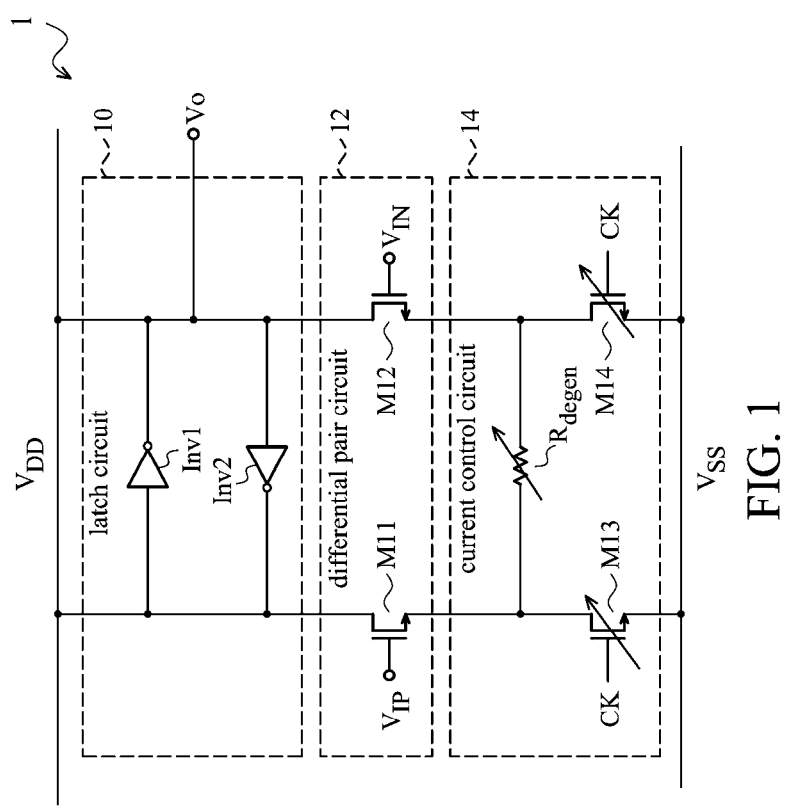
FIG. 1 is a circuit diagram of a clocked comparator 1 according to an embodiment of the invention.

FIG. 1 is a circuit diagram of a clocked comparator 1 according to an embodiment of the invention. The clock comparator 1 has a built-in comparison offset voltage $V_{OS}$. When two inputs $V_{IP}$ (first input) and $V_{IN}$ (second input) are provided, the clocked comparator 1 determines whether the input $V_{IP}$ differs from the input $V_{IN}$ by more than the offset voltage $V_{OS}$. Specifically, the comparator 1 may determine whether the input $V_{IP}$ exceeds the input $V_{IN}$ by more than the offset voltage $V_{OS}$, or, $V_{IP}-V_{IN} > V_{OS}$. The input signal $V_{IP}$ is a signal with a voltage level to be identified and the input signal $V_{IN}$ is a reference voltage that is to provide a reference for comparison with the input signal $V_{IP}$. The internal offset $V_{OS}$ is adaptable to circuit requirements, so that the comparator 1 may compare the input signal $V_{IP}$ to the reference voltage $V_{IN}$ with the various offset values dependent upon the setting, to derive various comparison results. For example, a quantizer circuit may employ a number of comparators 1, each with a different built-in offset $V_{OS}$, so that each comparator 1 may compare the input signal $V_{IP}$ to the reference voltage $V_{IN}$ on top of the different built-in offset $V_{OS}$, thereby arriving at a different quantization resolution for each comparator 1.

The clocked comparator 1 comprises a differential pair circuit 12, a current control circuit 14, and a latch circuit 10. The current control circuit 14 is connected in series to the differential pair circuit 12, which is subsequently connected in series to the latch circuit 10.

The differential pair circuit 12 and the current control circuit 14 are controlled by a clock signal CK to operate under either a compare mode or a reset mode. The clock signal CK is a signal that oscillates between a high and a low state periodically. In the compare mode, the clock signal CK rises from the low state (second logic state) to the high state (first logic level), the differential pair circuit 12 compares the input signal $V_{IP}$ to the reference voltage $V_{IN}$ to determine whether the input signal $V_{IP}$ exceeds the reference voltage $V_{IN}$ by more than the built-in offset $V_{OS}$, and the latch circuit 10 stores the comparison result. Depending on the voltage level of the input signal $V_{IP}$, the latch circuit 10 can switch to one stable state due to the positive feedback of the latch, indicating the polarity of ($V_{IP}-V_{IN}-V_{OS}$). In the reset mode, the clock signal CK falls from the high to low state, and the source terminals of the differential pair circuit eventually settle to a floating level ($V_{IP}-V_T$) or ($V_{IN}-V_T$), with $V_T$ being the threshold voltage of the transistors M11 and M12. As a consequence, the differential pair circuit 12 ceases to draw any current that is strong enough to record another comparator result to the latch circuit 10.

The differential pair circuit 12 contains two circuit branches, wherein one branch receives the input signal $V_{IP}$ and the other branch receives the reference voltage $V_{IN}$. Each circuit branch has an unequal current drawing ability from the other circuit branch, producing the built-in offset voltage $V_{OS}$ in the differential pair circuit 12. The current control circuit 14 is configured to set the current drawing abilities of the two circuit branches of the differential pair circuit 12 in the unequal or unbalanced state. The differential pair circuit 12 comprises transistors M11 and M12, wherein each transistor is placed on a separate circuit branch, receiving the input signal $V_{IP}$ and the reference voltage $V_{IN}$. In some embodiments, the current control circuit 14 drives the transistor M11 with a weaker ability of drawing current than that of the transistor M12. Consequently, the input signal $V_{IP}$ has to exceed the reference voltage $V_{IN}$ by more than the offset voltage $V_{OS}$ before the transistor M11 can draw a current which exceeds that of the transistor M12.

The current control circuit 14 is configured to control the transistors M11 and M12 in a manner such that the current drawing abilities of the transistors M11 and M12 are unequal. The current control circuit 14 comprises first and second tail transistors M13 (first resistor) and M14 (second resistor), and a degenerative resistor $R_{degen}$ (third resistor) coupled between the tail transistors M13 and M14. The comparator 1 contains an internal offset $V_{OS}$ when the device sizes of the two tail transistors M13 and M14 are not equal. The magnitude of the offset $V_{OS}$ is controlled by the difference of the device sizes of the tail transistors M3 and M4. Further, the internal built-in the offset $V_{OS}$ can also be controlled by the impedance of the degeneration resistor $R_{degen}$. The resistance change in the degenerative resistor $R_{degen}$ can increase or decrease the built-in offset range generated by the transistors M13 or M14. The degenerative resistor $R_{degen}$ may be implemented by a transistor (not shown) operated in the triode region, wherein the resistance value of the degenerative resistor $R_{degen}$ may be controlled by an analog control signal (not shown).

The built-in offset $V_{OS}$ may be constant or dynamic. Dynamic offset can be realized by varying the impedances of the source degeneration resistor $R_{degen}$ or varying the sizes of the effective tail transistors M13 and M14. The degeneration resistor $R_{degen}$ may be implemented by a MOS transistor working in the triode region. In some implementations, the tail transistors M13 and M14 contain groups of transistor arrays, wherein each group of transistor array contains a number of transistors coupled in parallel to one another. For example, one group of array might contain a different number of turned-on transistors from that of the other group. The transistors in the transistor arrays may be separately turned on or off by the digital control signal $S_{offset\_ctrl}$ (not shown). The current drawing ability is proportional to the device size of the transistors or the number of the transistor being turned on in the transistor array. The internal offset $V_{OS}$ increases with the difference of the current drawing abilities for the transistors M11 and M12 of the differential pair circuit 12. For example, the internal offset $V_{OS}$ may be increased by increasing the difference of numbers of turned-on transistors in the two groups of transistor arrays or by increasing the resistance of the degeneration resistor $R_{degen}$.

The latch circuit 10 (amplification circuit) includes two inverters Inv1 and Inv2, serving to amplify and record the information of the polarity of $(V_{IP}-V_{IN}-V_{OS})$. The information of the polarity of $(V_{IP}-V_{IN}-V_{OS})$ is the comparator output Vo of the comparator 1.

The offset tuning range of the comparator 1 is proportional to the common mode voltage at the source terminals of the transistor pair M11 and M12. The offset tuning range of the comparator 1 is higher than that in the conventional circuits, wherein the comparator speed remains the same as the conventional arts, and the kick-back noise of the embodiment is balanced due to the balanced input differential pair.

Figure 2:
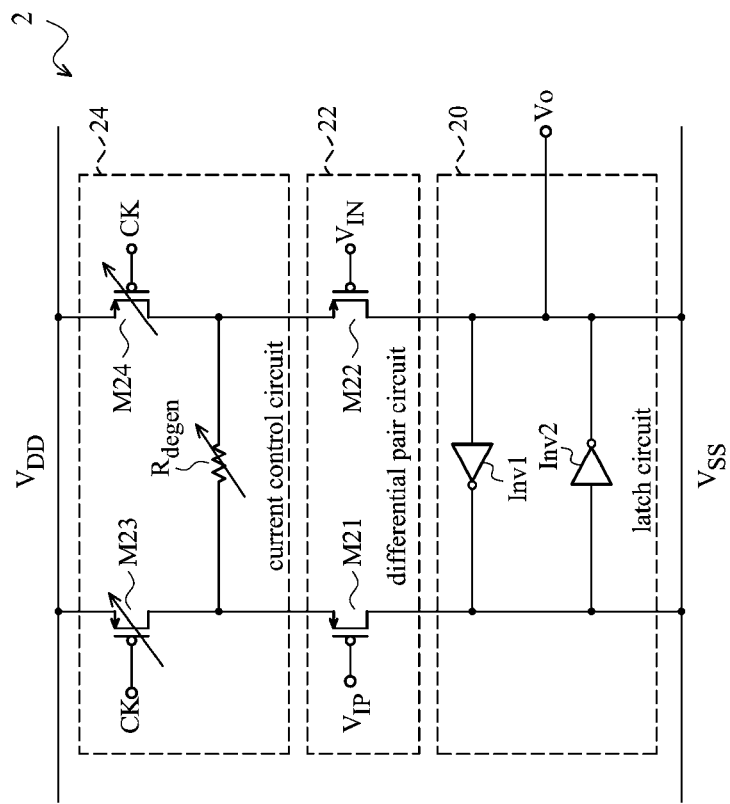
FIG. 2 shows a circuit diagram of a clocked comparator 2 according to another embodiment of the invention.

FIG. 2 shows a circuit diagram of a clocked comparator 2 according to another embodiment of the invention. The clocked comparator 2 operates with the same principle as the clock comparator 1, with the exception that instead of using the NMOS transistors, the circuit 2 employs PMOS transistors in the differential pair circuit 22 and current control circuit 24.

Figure 3:
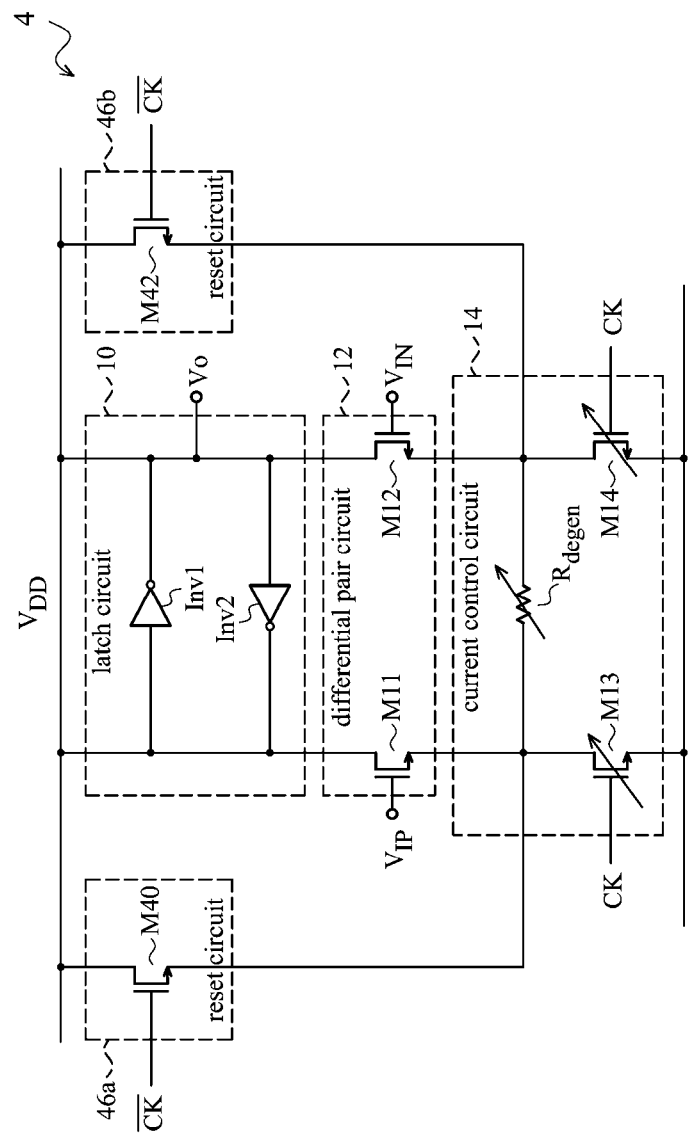
FIG. 3 is a circuit diagram of a clocked comparator 4 according to still another embodiment of the invention.

FIG. 3 is a circuit diagram of a clocked comparator 4 according to still another embodiment of the invention. The comparator 4 operates similarly to the comparator 1, and incorporates reset circuits 46a and 46b for the reset mode. Instead of leaving the differential pair circuit 12 floating at $(V_{IP}-V_T)$ or $(V_{IN}-V_T)$ in the reset mode, as with the comparator 1, the clock comparator 4 utilizes the reset circuits 46a and 46b to reset the differential pair circuit 12 by a known (predetermined) voltage level during the clock reset. In the case of the comparator 1, when leaving the source terminals of the differential transistor pair M11 and M12 floating, the source terminal voltages would be set by $V_{IP}$, $V_{IN}$, and $V_T$. As data speed increases, the input voltages fluctuate at a high speed. Eventually, the source terminals are not able to keep up with the fluctuations of the input voltages, resulting in faulty comparison results because of the uncertain initial state in the compare mode. The comparator 4 incorporates the reset circuits 46a and 46b to force the source terminals of the differential pair circuit to $(V_{DD}-V_T)$ in the reset mode, so that the comparator 4 is able to work at a higher input sampling speed than the comparator 1.

The reset circuits 46a and 46b are tied to the voltage supply $V_{DD}$ and controlled by the inverted clock signal $\overline{CK}$. The reset circuits 46a and 46b contain NMOS transistors M40 and M42 respectively. In the reset mode, the current control circuit 14 isolates the differential pair circuit 12 from the common ground $V_{SS}$, wherein the inverted clock signal $\overline{CK}$ is switched to the high state, and the transistors M40 and M42 are turned on and diode-connected to provide a predetermined voltage level $(V_{DD}-V_T)$ to source terminals of the differential transistor pair M11 and M12. By tying the fixed voltage level $(V_{DD}-V_T)$ to the source terminals of the transistor pair M11 and M12, the differential pair circuit 12 can perform each input comparison operation based on the same initial condition. The predetermined voltage level $(V_{DD}-V_T)$ is selected instead of $V_{DD}$ in order to reduce the extra time and power while pulling source terminals of the differential transistor pair M11 and M12 down to ground in the compare mode.

It is notable that although FIGS. 1-3 show clocked comparators with the degeneration resistor $R_{degen}$, in some implementations, the degeneration resistor $R_{degen}$ may be removed from the comparator circuits without affecting circuit operations, provided that the two circuit branches in the differential pair circuit are arranged in the manner such that each possess a different current drawing ability from the other. Further, people having ordinary skills in the art would recognize the embodiments in FIGS. 1-3 may be adapted to differential circuits capable of comparing a differential-signal pair, $V_{IP}$ and $V_{IN}$, to the internal offset, $V_{OS}$, by the principle of the invention.

Figure 4A:
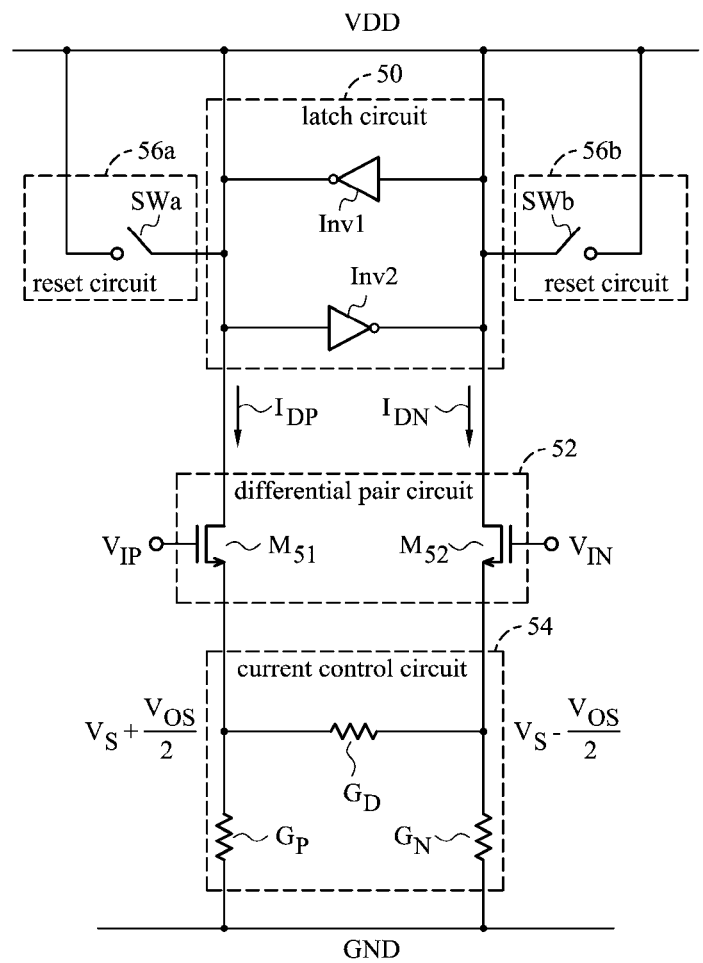
FIG. 4A illustrates a circuit diagram of a clocked comparator 5 according to yet another embodiment of the invention.
Figure 4B:
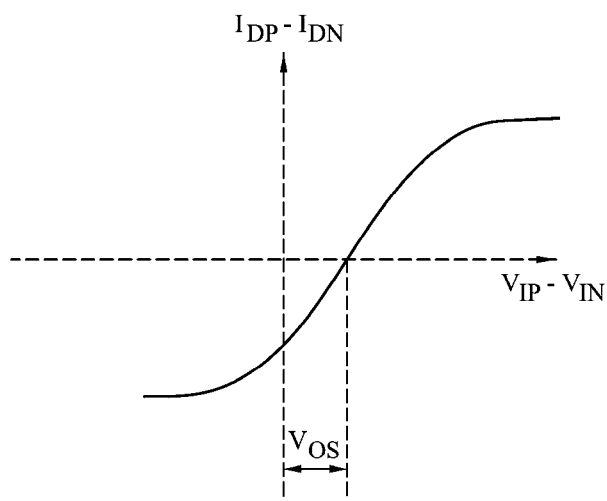
FIG. 4B shows a relationship of an input voltage difference ($V_{IP}$-$V_{IN}$) and a drawn current difference ($I_{IP}$-$I_{IN}$) for the clocked comparator 5.

FIG. 4A illustrates a circuit diagram of a clocked comparator 5 according to yet another embodiment of the invention. FIG. 4B shows a relationship of an input voltage difference ($V_{IP}$-$V_{IN}$) and a drawn current difference ($I_{IP}$-$I_{IN}$) for the clocked comparator 5. The comparators 1 through 4 are sense amplifier-based circuits, with source degeneration and imbalanced tail branches. FIG. 4B depicts a simplified circuit model for the comparator 1, in accompany with the voltage-current difference relationship diagram to illustrate the circuit operation in details.

The tail transistors, operating in the triode region, are modeled as resistors with conductances $G_P$ and $G_N$. At a comparator trip point, $I_{DP}$ and $I_{DN}$ are equal. Half of the difference of the imbalanced tail currents goes through the degeneration resistor $R_{degen}$, or the conductance GD in equivalence, creates a voltage drop. At the point where the input transistors M51 and M52 exhibit the same gate-source voltage drop $V_{gs}$, the corresponding drain currents $I_{DP}$ and $I_{DN}$ are identical ($I_{DP}$=$I_{DN}$) to each other, wherein the voltage drop across the degeneration resistor $R_{degen}$ is defined as the internal offset $V_{OS}$. Referring to FIG. 4B, the current difference ($I_{IP}$-$I_{IN}$) is approximately proportional to the voltage difference ($V_{IP}$-$V_{IN}$), and at the trip point ($I_{DP}$=$I_{DN}$), the input voltage difference ($V_{IP}$-$V_{IN}$) is the internal offset $V_{OS}$. The internal offset $V_{OS}$ is proportional to the conductance difference ($G_P$-$G_{IN}$) with a range of the internal offset $V_{OS}$ set by the common mode voltage across the source degeneration resistor $R_{degen}$, $V_S$.

Accordingly, the tuning range for the internal offset $V_{OS}$ is determined by the voltage difference across the degeneration resistor Rdegen. Unlike the traditional approaches, at the trip point, the gate-source voltage drops $V_{gs}$, as the input transistors M51 and M52 are the same, and the drain current $I_{DP}$ is equivalent to the drain current $I_{DN}$, preventing the comparator 5 from entering into a saturation condition, which occurs when the drain currents $I_{DP}$ and $I_{DN}$ differs by too much, such that the internal offset voltage $V_{OS}$ no longer has an effect on the comparator.

The reset circuits 56a and 56b are included to reset the latch circuit 50 and may be controlled by the clock signal CK (not shown). During the reset mode, the clock signal CK is at the low state, the switches SWa and SWb can be closed to reset the latch circuit 50 to the voltage supply level $V_{DD}$. On the contrary, during the compare mode, the clock signal is in the high state, wherein the switches SWa and SWb can be opened so that the latch circuit 50 is free to record the comparison result from the differential pair circuit 52.

Figure 5:
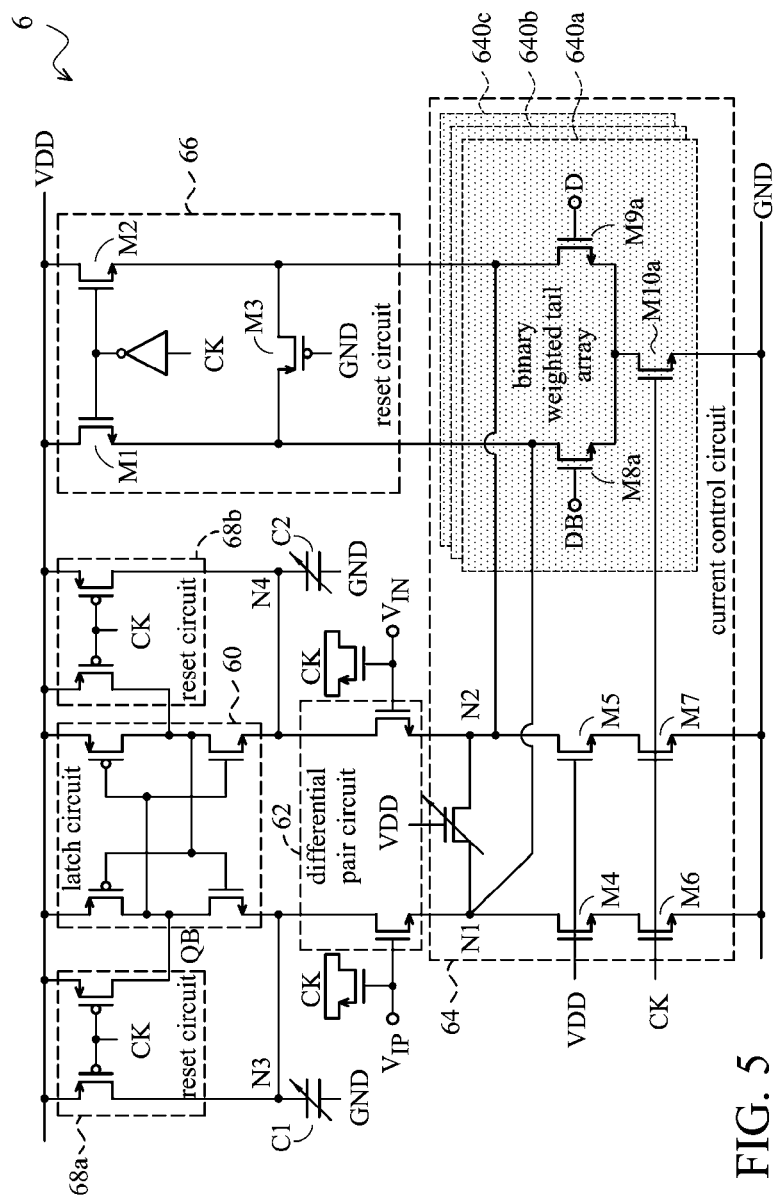
FIG. 5 is a circuit diagram of a clocked comparator 6 according to yet still another embodiment of the invention.

FIG. 5 is a circuit diagram of a clocked comparator 6 according to yet still another embodiment of the invention, comprising a latch circuit 60, a differential pair circuit 62, a current control circuit 64, a reset circuit 66, reset circuits 68a and 68b, and other capacitors C1, C2, and transistors. The latch circuit 60 and differential pair circuit 62 are identical to the latch circuit 10 and differential pair circuit 12. Therefore reference can be found in the preceding paragraphs. The internal offset $V_{OS}$ for the comparator 6 may be configured by the current control circuit 64 and the capacitors C1 and C2. A 10-bit digital control signal $S_{offset\_ctrl}$ is used to control the current control circuit 64 and the capacitors C1 and C2 to produce a desirable internal offset $V_{OS}$, with the 4-bit MSB of the digital control signal $S_{offset\_ctrl}$ configuring the current control circuit 64, and the 6-bit Least Significant Bit (LSB) of the digital control signal $S_{offset\_ctrl}$ configuring the capacitors C1 and C2.

The current control circuit 64 operates with the same principle as explained for the current control circuit 14, with some circuit variations where the current control circuit 64 is separated into a fixed transistor block and an adaptable transistor block. The fixed transistor block defines basic current drawing abilities for the differential pair circuit 62 while the adaptable transistor block provides adaptable current drawing abilities for the differential pair circuit 62. An NMOS transistor between nodes N1 and N2 acts as the degeneration resistor, with a gate terminal connected to the $V_{DD}$, operated in the triode region, and is adaptable by a degeneration control signal (not shown) to produce a regeneration resistance which also affects the current drawing abilities for the differential pair circuit 62. The fixed transistor block, the adaptable transistor block and the regeneration transistor between nodes N1 and N2 together produce the ultimate current drawing abilities for the input and reference branches.

The fixed transistor block comprises the transistors M4 through M7 that cannot be shut off during the compare mode. The adaptable transistor block comprises a tail transistor array 640 that includes tail transistor sets 640a through 640c, wherein each transistor set contains a tail transistor pair and a clock transistor. The tail transistor array 640 is controllable by 4-bit Most Significant Bit (MSB) of the digital control signal $S_{offset\_ctrl}$. The value of the digital control signal $S_{offset\_ctrl}$ may be determined and configured by a calibration procedure run during a factory test or a system startup. Take the tail transistor set 640a as an example, the tail transistor pair M8a and M9a may be turned on or off by digital control signals DB and D of the digital control signal $S_{offset\_ctrl}$ respectively. When the tail transistor M8a is turned on, the circuit drawing ability on the circuit branch of the input signal $V_{IP}$ is increased accordingly. Whereas when the tail transistor M9a is turned on, the circuit drawing ability on the circuit branch of the reference signal $V_{IN}$ is increased. The number of turn-on transistors results is in direct proportion to the current drawing ability of the corresponding circuit branch. The internal offset $V_{OS}$ increases with an increase in the difference between the current drawing abilities of the input and the reference circuit branches. In some embodiments, by controlling the tail transistor array and the regeneration transistor, the internal offset $V_{OS}$ may be tuned to a value between 30 and 80 mV.

The 6-bit LSB of the digital control signal $S_{offset\_ctrl}$ controls the variable capacitors C1 and C2 at outputs N3 and N4 of the differential pair circuit 62, generating a ±80 mV offset range for the internal offset $V_{OS}$ with fine tuning steps of 2-3 mV. The overall offset range can be further scaled by varying the source degeneration transistor. The kick-back noise, mostly happening in the common mode, is reduced by using additional NMOS capacitors at the inputs with a slightly delayed clock to match the internal-node timing.

The reset circuit 66 serves to reset the node N1 and N2 by the predetermined voltage level ($V_{DD}$-$V_T$) in the reset mode, as discussed for the reset circuit 46a and 46n in the FIG. 3. The reset circuit 66 is configured as the diode-connected NMOS transistors M1 and M2, when the CK is at the low state. The PMOS transistor M3, with a gate terminal connected to ground GND, is configured to remove the voltage difference of the source terminals of the transistors M1 and M2. In the compare mode, the transistor M3 is automatically turned off when voltages at the node N1 and N2 fall below $V_T$, with $V_T$, which is the threshold voltage of the transistor. Further, the reset circuits 68a and 68b are configured to reset various nodes in the latch circuit 60 by the predetermined level ($V_{DD}$-$V_T$) during the reset mode.

Figure 6:
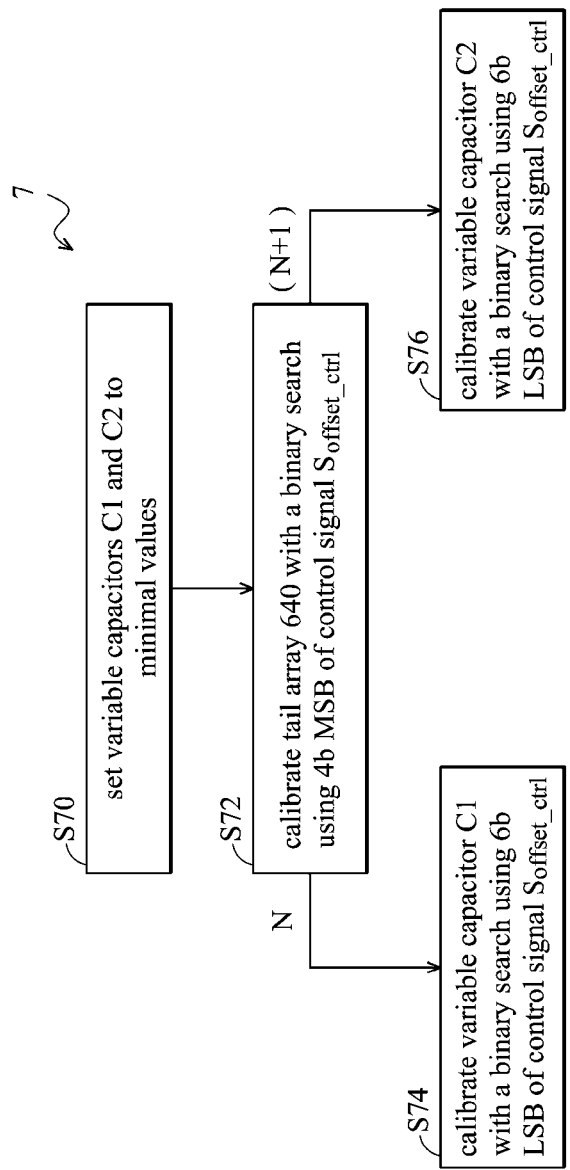
FIG. 6 is a flowchart of a calibration method 7 according to an embodiment of the invention.

FIG. 6 is a flowchart of a calibration method 7 according to an embodiment of the invention, incorporated by the clocked comparator 7 in FIG. 6.

The built-in offsets $V_{OS}$ of the comparator 6 can be calibrated using a binary search by connecting the input terminal $V_{IP}$ and $V_{IN}$ to a target offset voltage that may be generated by a resistor string. The resistor string comprises a numbers of resistor units connected in series and acts as a voltage divider outputting a certain number of target offset voltages. Upon startup of the calibration method 7, the input terminal $V_{IP}$ is connected to the target offset voltage and the reference terminal $V_{IN}$ is connected to the reference voltage. The variable capacitors on N3 and N4 are configured to be the minimal value (S70), while the tail transistor array 640 are adjusted by the 4-bit MSB of the digital control signal $S_{offset\_ctrl}$ to determine a code N, with which the comparator 6 outputs a comparison result Q as 1 and the next code (N+1) the comparison result Q as 0 (S72). Having the code N being determined, the calibration method 7 can further perform a fine calibration for the comparator 6 with the variable capacitors C1 and C2 by the code N or the code (N+1). If the code N is chosen (S74), the variable capacitor C1 is adjusted to further increase the built-in offset $V_{OS}$. If the code (N+1) is chosen (S76), the variable capacitor C2 is increased to decrease the built-in offset $V_{OS}$. The binary search is again performed for calibrating the 6-bit LSB code for the variable capacitors C1 and C2, until the comparator output Q is randomly switched between 1 and 0 due to a circuit noise.

Figure 7:
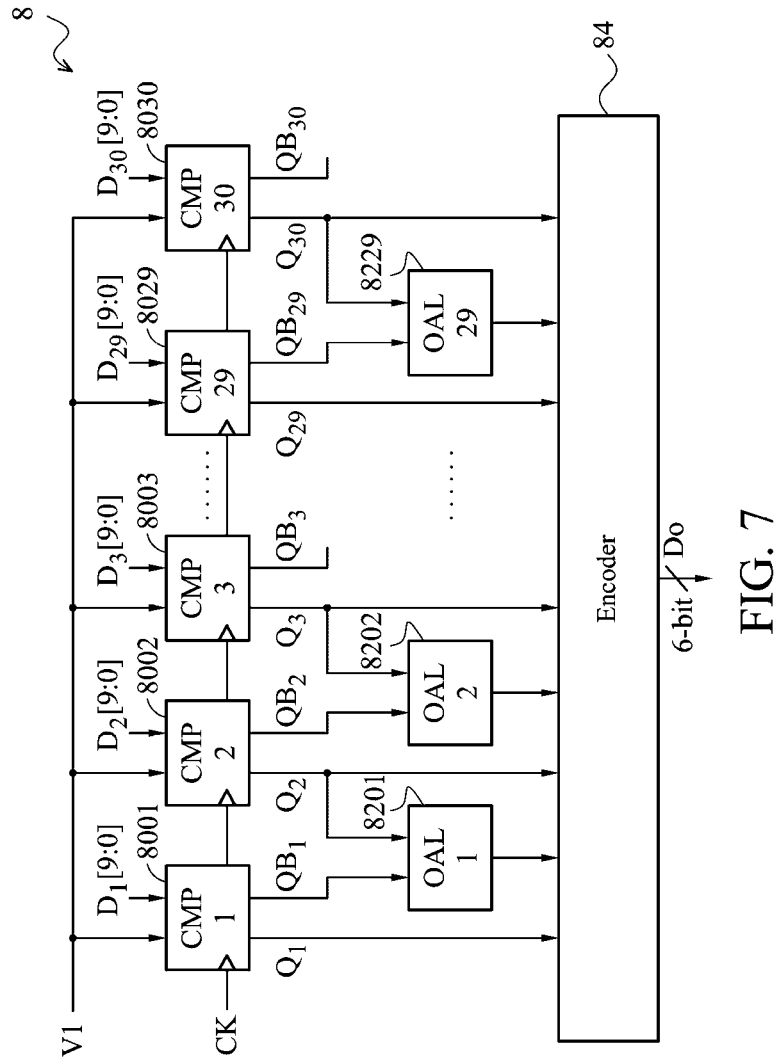
FIG. 7 displays a block diagram of a flash Analog-to-Digital Converter (ADC), employing the clocked comparator disclosed in the invention.

FIG. 7 displays a block diagram of a 6-bit flash Analog-to-Digital Converter (ADC) 8, employing the clocked comparator disclosed in the invention.

The ADC 8 contains 30 clocked comparators 8001-8030 and 29 offset-averaging SR latches (OSL) 8201-8229 that quantize an input signal V1 into 60 levels with an ideal effective number of bits (ENOB) of 5.88 bits. Each clocked comparator CMP samples the input V1 and compares the sampled value with the built-in offset $V_{OS}$ set by a 10-bit digital code and undergoes the calibration process 7 detailed in the method 7. Corresponding reference voltages are fed to inputs of the comparators CMP to calibrate the comparators one after another. Binary search is used to calibrate the 10-bit digital code until the calibrated comparator produces an output signal switching alternately between high and low states. Each offset-averaging SR latch is connected to the outputs of two adjacent comparators. For example, the offset-averaging SR latch OAL 1 is connected to the comparators CMP1 and CMP2. The outputs of the comparators and the outputs of the offset-averaging latches are encoded into 6-bit code $D_O$ by the encoder 84.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A comparator, comprising:
   a differential pair circuit, comprising first and second comparator transistors, configured to compare a first input and a second input according to a clock signal to generate a result indicating whether a difference of the first and second inputs exceeds an internal offset; and
   a current control circuit, coupled in series with the differential pair circuit, configured to provide unequal abilities of drawing currents for the first and second comparator transistors, respectively;
   wherein the current control circuit comprises first and second transistors, and the first and second transistors have different device sizes and configured by digital control signals.

2. The comparator of claim 1, wherein the internal offset varies with a difference between the unequal abilities of drawing currents.

3. The comparator of claim 1, wherein the current control circuit comprises first, second, and third resistors, and
   the third resistor is coupled between the first and second resistors, and
   the first, second, and third resistors are adaptable to change the abilities of drawing currents for the first and second comparator transistors;
   wherein the first and second transistors are configured to be the first and second resistors, respectively.

4. The comparator of claim 1, wherein the current control circuit comprises first and second arrays of transistors, which have different numbers of transistors configured by digital control signals;
   wherein the first and second arrays of transistors contain the first and second transistors, respectively.

5. The comparator of claim 1, further comprises a reset circuit coupled between the current control circuit and a voltage supply, capable of setting a reference voltage point in the differential pair circuit to a predetermined voltage level.

6. The comparator of claim 5, wherein the reset circuit comprises a transistor connected in a diode configuration for resetting the differential pair circuit by the predetermined voltage level.

7. The comparator of claim 1, wherein the differential pair circuit compares the first and second inputs when the clock signal is at a first logic level, and is reset to a predetermined value when the clock signal is at a second logic level.

8. The comparator of claim 1, wherein the differential pair circuit is arranged to compare the first and second inputs by determining a polarity of a difference of the first input and the second input in combination with the internal offset.

9. An amplifier, comprising:
   a differential pair circuit, comprising first and second comparator transistors, configured to compare a first input and a second input when a clock signal is at a first logic level to generate a result indicating whether a difference of the first and second inputs exceeds an internal offset;
   a current control circuit, configured to provide unequal abilities of drawing currents for the first and second comparator transistors respectively;
   an amplification circuit, amplifying the generated result from the differential pair circuit; and
   a reset circuit, capable of setting a reference voltage point in the differential pair circuit to a predetermined voltage level when the clock signal is at a second logic level;
   wherein the current control circuit comprises first and second transistors.

10. The amplifier of claim 9, wherein the internal offset varies with a difference between the unequal abilities of drawing currents.

11. The amplifier of claim 9, wherein the current control circuit is coupled in series to the differential pair circuit.

12. The amplifier of claim 9, wherein the current control circuit comprises first, second, and third resistors,
the third resistor is coupled between the first and second resistors, and
the first, second, and third resistors are adaptable to change the abilities of drawing currents for the first and second comparator transistors;
wherein the first and second transistors are configured to be the first and second resistors, respectively.

13. The amplifier of claim 9, wherein the first and second transistors have different device sizes and configured by digital control signals.

14. The amplifier of claim 10, wherein the current control circuit comprises first and second arrays of transistors, which have different numbers of transistors configured by digital control signals;
wherein the first and second arrays of transistors contain the first and second impedances, respectively.

15. The amplifier of claim 9, wherein the reset circuit is coupled between the current control circuit and a voltage supply.

16. The amplifier of claim 9, wherein the reset circuit comprises a transistor connected in a diode configuration for resetting the differential pair circuit by the predetermined voltage level.

17. The amplifier of claim 9, wherein the differential pair circuit compares the first and second inputs by determining a polarity of a difference of the first input and the second input in combination with the internal offset.

* * * * *